United States Patent [19]
Tsukikawa

[11] Patent Number: 6,121,812
[45] Date of Patent: Sep. 19, 2000

[54] DELAY CIRCUIT HAVING DELAY TIME FREE FROM INFLUENCE OF OPERATION ENVIRONMENT

[75] Inventor: Yasuhiko Tsukikawa, Hyogo, Japan

[73] Assignee: Mitsubishi Denki Kabushiki Kaisha, Tokyo, Japan

[21] Appl. No.: 08/781,792

[22] Filed: Jan. 10, 1997

[30] Foreign Application Priority Data

May 14, 1996 [JP] Japan .................................. 8-119021

[51] Int. Cl.⁷ .................................................. H03K 5/13
[52] U.S. Cl. .................. 327/280; 327/266; 327/261; 327/336; 327/344; 327/281
[58] Field of Search .................................... 327/261, 263, 327/264, 266, 268, 274, 262, 287, 281, 77, 280, 288, 336, 344; 365/194

[56] References Cited

U.S. PATENT DOCUMENTS 5,357,468  10/1994  Satami et al. ............................ 365/194

FOREIGN PATENT DOCUMENTS 354128244  10/1979  Japan ..................................... 327/262
57-180228  11/1982  Japan .

*Primary Examiner*—Dinh T. Le
*Attorney, Agent, or Firm*—McDermott, Will & Emery

[57] ABSTRACT

A delay circuit includes a reference voltage generation circuit for generating a reference voltage which changes to a prescribed voltage level during the operation of a comparison circuit, an RC delay stage for integrating an input signal, a comparison circuit for comparing an output signal from the RC delay stage and the reference voltage of the reference voltage generation circuit, and a logic circuit for buffering the output signal of the comparison circuit. Since the reference voltage is pulled to a prescribed voltage level only during a comparison operation, the reference voltage may accurately be maintained at the prescribed voltage level only when necessary free from the influence of other circuits and noises. A delay circuit with reduced current consumption which is capable of changing an output signal with fixed delay time independently of the influence of fluctuations of the power supply voltage and the input logical threshold value of a logic circuit in a succeeding stage is provided.

15 Claims, 10 Drawing Sheets

FIG.1
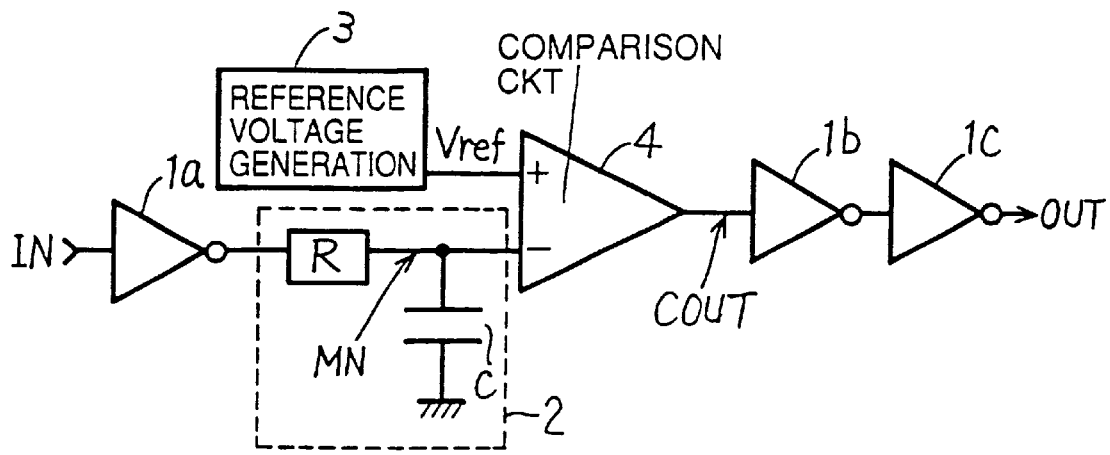
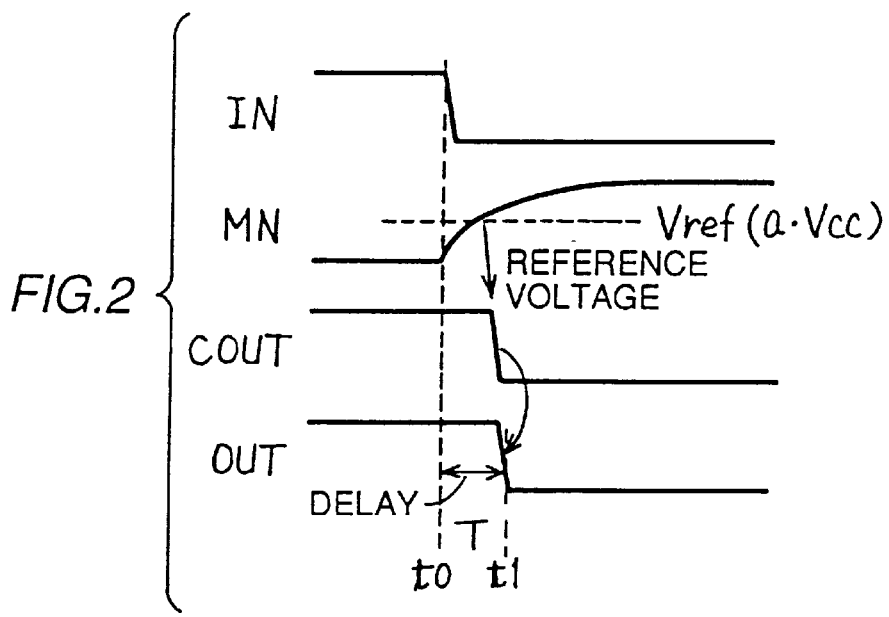
FIG.2

FIG.12 PRIOR ART
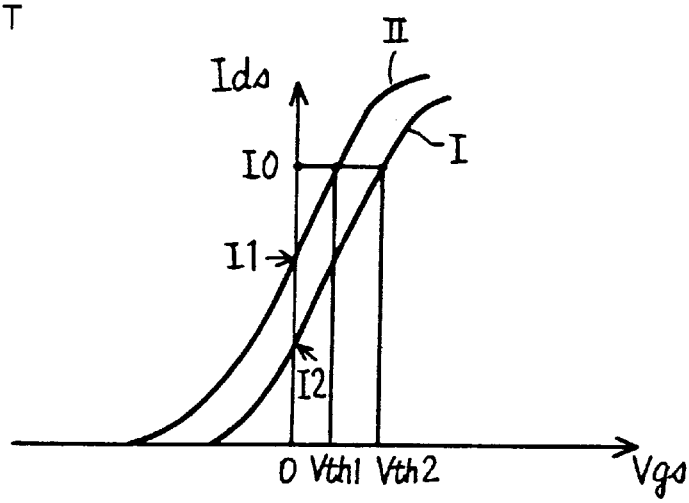
FIG.13 PRIOR ART
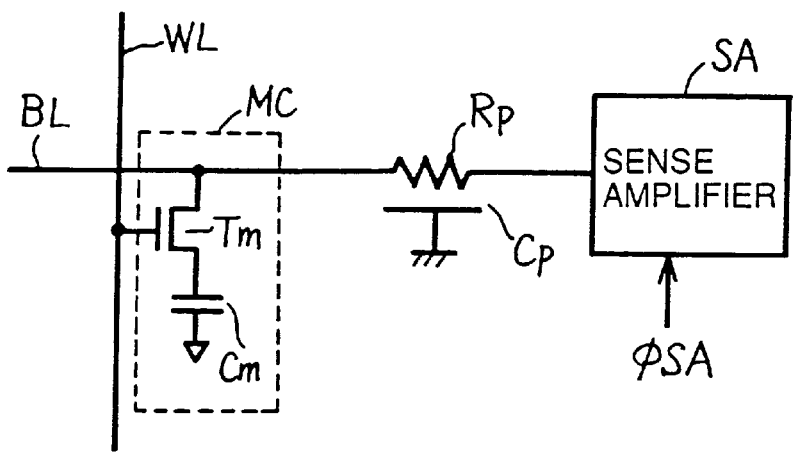
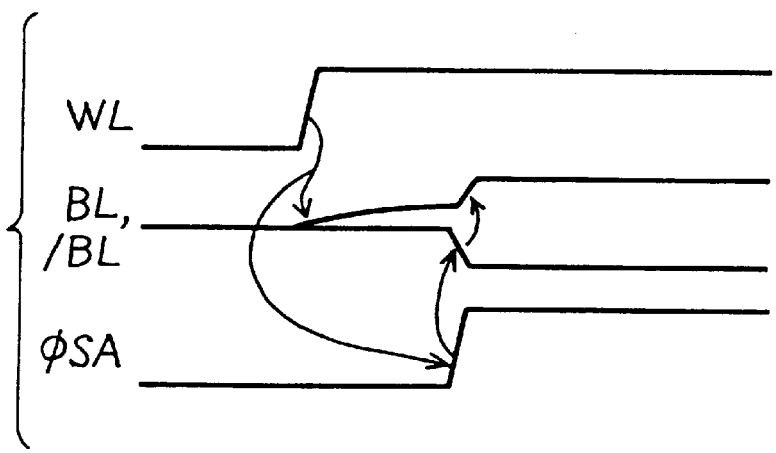
FIG.14 PRIOR ART FIG.15A PRIOR ART
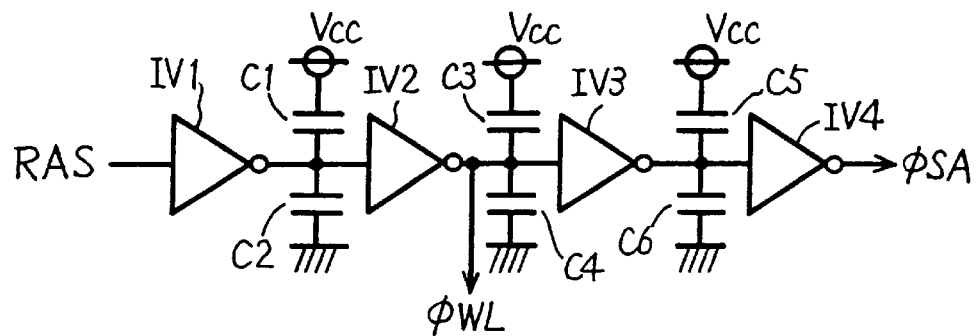
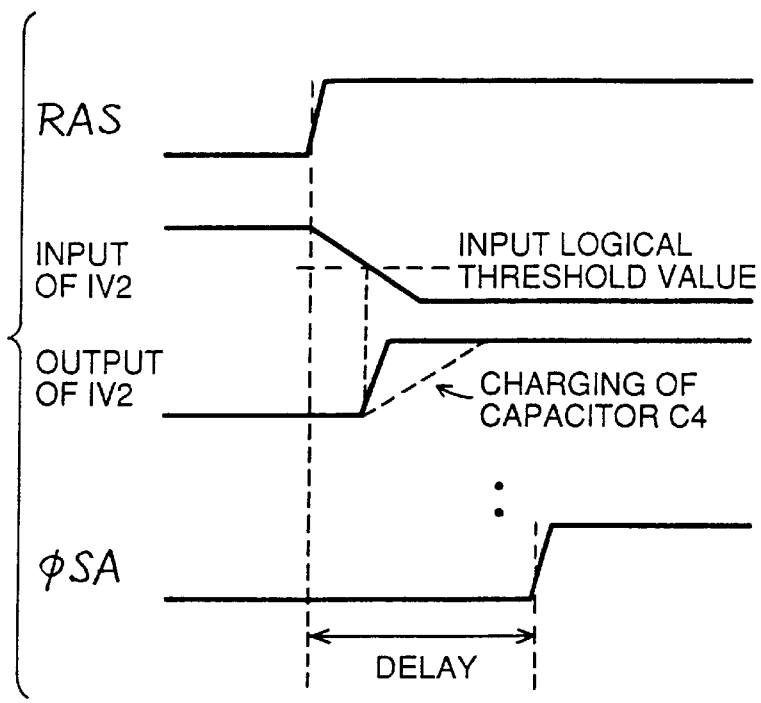
FIG.15B PRIOR ART

DELAY CIRCUIT HAVING DELAY TIME FREE FROM INFLUENCE OF OPERATION ENVIRONMENT

BACKGROUND OF THE INVENTION

1. Field of the Invention

The present invention relates generally to a delay circuit for delaying an applied signal by a prescribed time period, and more particularly to a delay circuit for use in generation of an internal control signal in a semiconductor memory device.

2. Description of the Background Art

In recent years, the integration density of a semiconductor integrated circuit has tremendously increased. As the integration density increases, the number of transistors integrated per one chip increases for the same chip area, and therefore scaling down of transistors has inevitably advanced in order to reduce the transistor size. As the scaling down of the transistor proceeds, power supply voltage Vcc is reduced from for example 5V to 3.3V in order to secure the reliability of the insulating film of an MOS transistor (an insulating gate type field effect transistor). Meanwhile, although the number of transistors thus increases, in order to keep current in a chip (semiconductor integrated circuit device) in a stand-by state from increasing, and to keep current consumption when the semiconductor integrated circuit device is in a stand-by state as small as possible the absolute value Vth of the threshold voltage of the MOS transistor may not be smaller than a certain value.

FIG. 12 is a graph showing the relation between the drain current Ids and the gate-source voltage Vgs of an n channel MOS transistor. The threshold voltage of an MOS transistor is defined as gate-source voltage Vgs upon flowing of a certain drain current Ids. If, therefore, the threshold voltage Vth2 of the n channel MOS transistor is reduced to threshold voltage Vth1, curve I-V indicating the correlation between the drain current and the gate-source voltage transits from curve I to curve II. In this case, for the gate-source voltage Vgs of the n channel MOS transistor of 0V, current I1 flows in curve II and the current I1 is larger than current I2 in curve I. Currents I1 and I2 are usually referred to as "subthreshold current". For a p channel MOS transistor, inversion of the sign of gate-source voltage Vgs provides a curve indicating the relation between the drain current and the gate-source voltage.

As illustrated in FIG. 12, the stand-by current of the MOS transistor, in other words the subthreshold current decreases as the absolute value Vth of threshold voltage increases. If the absolute value of gate-source voltage Vgs is higher than the absolute value of the threshold voltage, a large drain current Ids abruptly passes through the MOS transistor. Therefore, based on the relation between the high speed operation ability of the MOS transistor by the current driving capability and the stand-by current according to subthreshold current, the absolute value Vth of the threshold voltage of about 0.6V is usually used.

ON current at the time of the conduction of the MOS transistor (current in a saturated state) is determined by the difference between power supply voltage Vcc and the absolute value of threshold voltage, in other words by Vcc−Vth. If Vcc=3.3V and Vth=0.6V, Vcc−Vth=2.7V holds. For the voltage value of power supply voltage Vcc, a deviation of ±10%V from the rated voltage is tolerated. Therefore, for a semiconductor integrated circuit with Vcc of 3.3V, the lower limit of power supply voltage Vcc=3.0V, and the upper limit Vcc=3.6V. In this case, the difference between power supply voltage Vcc and the absolute value Vth of threshold voltage, Vcc−Vth has a deviation of about 25% from 2.4V to 3.0V. The current driving capability of the MOS transistor, in other words drain current Ids which may be supplied by the transistor is approximately in proportion to the square of Vcc−Vth. More specifically, the drain current Ids of the MOS transistor in a saturated region is given by:

$$Ids = \beta(Vgs - Vth)^2 \sim \beta(Vcc - Vth)^2$$

wherein, the relation represented by $|Vds| \geq |Vds - Vth|$ is established in the saturated region. Vds indicates the drain-source voltage of the MOS transistor. $\beta$ is constant parameter determined by factors such as the material of a gate insulating film used in the MOS transistor and the ratio of channel width W to channel length L.

Therefore, in use under rated voltage, if Vcc−Vth deviates in the range of 20%, the current driving capability of the MOS transistor deviates in the range of about 55% ($1.25^2$ = 1.56). A description follows on how the deviations of power supply voltage Vcc and the absolute value Vth of threshold voltage influence, the design of a semiconductor integrated circuit. In the following description, a dynamic random access memory (DRAM) will be discussed as an example of semiconductor integrated circuit devices.

FIG. 13 is a diagram schematically showing the configuration of a memory cell array portion in the DRAM. In FIG. 3, a memory cell MC is provided corresponding to a crossing portion of a word line WL and a bit line BL. Memory cells MC are arranged in a matrix of rows and columns, word line WL is connected with a row of memory cells, and bit line BL is connected with memory cells corresponding to a column. Usually in the "folded bit line pair" configuration, bit lines BL and /BL are provided in pairs. When memory cell data is determined, one of bit line BL and /BL provides reference voltage. Memory cell MC includes a capacitor Cm for storing information in an electric charge form, and an n channel MOS transistor (access transistor) Tm conducting in response to the signal potential of word line WL and connecting capacitor Cm to bit line BL.

A sense amplifier SA provided for bit line BL senses and amplifies data held by memory cell MC which is read out on bit line BL. Sense amplifier SA is activated in response to a sense amplifier activation signal φSA, and differentially amplifies the potential relative to that of bit line /BL (not shown) which is complementary to bit line BL. Bit line BL has parasitic resistance Rp and parasitic capacitance Cp by the interconnection.

FIG. 14 is a waveform chart representing the operation of the sense amplifier in FIG. 13. Referring to FIG. 14, the operation of reading data from a memory cell will be described.

When a memory cycle starts, a row selection operation is executed according to an applied address signal, the potential of word line WL corresponding to the addressed row rises, and word line WL attains a selected state. In response to the rising of the potential of word line WL, access transistor Tm in memory cell MC conducts, and capacitor Cm is connected to bit line BL. Now, consider that bit line BL (and /BL) is precharged to an intermediate potential Vcc/2, and that capacitor Cm stores an "H" level. In this case, positive charge moves from capacitor Cm to bit line BL, thus raising the potential of bit line BL. The potential of bit line BL is transferred to sense amplifier SA through parasitic resistance Rp and parasitic capacitance Cp. The sense node of sense amplifier SA therefore gradually rises according to time constant Rp·Cp which is given by resistance Rp and parasitic capacitance Cp. If the potential of sense node (bit line BL) of sense amplifier SA increases enough, sense amplifier activation signal φSA is activated, and sense amplifier SA amplifies the potential of bit line BL (the potential of sense node).

In order to assure that sense amplifier SA senses and amplifies the storage information of memory cell MC, voltage (readout voltage) read out on bit line BL (sense node) must be large enough, and therefore a sufficient time period must be secured until sense amplifier activation signal φSA is activated since the rising of the potential of word line WL.

FIG. 15A is a diagram schematically showing the configuration of a sense amplifier activation signal generation portion. In FIG. 15A, the sense amplifier activation signal generation portion includes four stages of cascaded inverters IV1, IV2, IV3 and IV4 receiving an internal row address strobe signal RAS. Inverters IV2 to IV4 are each provided with a delaying capacitor at each input portion. More specifically, for inverter IV2, capacitors C1 and C2 are connected in series between power supply potential node Vcc and ground node, for inverter IV3, capacitors C3 and C4 are connected in series between power supply node Vcc and ground node, and to the input portion of inverter IV4, capacitors C5 and C6 are connected in series between power supply node Vcc and ground node. Capacitors C1, C3 and C5 connected to power supply node Vcc each have the function of delaying the falling of a signal, and capacitors C2, C4 and C6 connected to the ground node each has the function of delaying the rising of a signal. Necessary delay is given by time required for charging/discharging the capacitors. FIG. 15A arrangement includes another configuration in which word line driving signal φWL is generated from internal row address strobe signal RAS through inverter IV1, capacitors C1 and C2, and inverter IV2.

FIG. 15B is a waveform chart representing the operation of the sense amplifier activation signal generation portion shown in FIG. 15A. If row address strobe signal RAS rises from an inactive L level to an active H level, the output signal of inverter IV1 responsively falls from an H level to an L level. In this case, time required for discharging capacitor C1 makes the change of the signal gradual, and the potential of the input portion of inverter IV2 falls gradually enough as compared to internal row address strobe signal RAS. If the signal potential of the input portion of inverter IV2 becomes lower than the input logical threshold value of inverter IV2, the output signal of inverter IV2 rises from an L level to an H level. (The time required for charging capacitor C4 is indicated in broken line in FIG. 15B.) The operation is executed also in inverters IV3 and IV4, rendering each signal change to be gradual and sense amplifier activation signal φSA output from inverter IV4 attains an H level active state after passage of the total delay time of inverters IV1 to IV4 and delay time given by the time required for charging/discharging capacitors C1 to C6. Relatively large delay time can be provided in a small occupied area, taking advantage of charging/discharging of capacitors.

FIG. 16A is a diagram showing the configuration of an inverter by way of illustration. In FIG. 16A, an inverter IV includes a p channel MOS transistor PT connected between power supply node Vcc and an output node and receiving an input signal IN at its gate, and an n channel MOS transistor NT connected between the output node and the ground node and receiving input signal IN at its gate. For inverter IV formed of the CMOS transistor, the operation speed changes in response to the voltage level of power supply voltage Vcc. This is because the voltage level of input signal IN applied to the gate changes in response to the level of power supply voltage Vcc. In an unsaturated region, the drain-source voltage Vds affects the drain current.

As described above, the current driving capability of the MOS transistor is approximately in proportion to the square of Vcc−Vth. Therefore, as the voltage level of power supply voltage Vcc rises, the driving capability increases, and therefore the speed of the change of an output signal OUT increases as illustrated in FIG. 16B. If therefore sufficient delay time is secured for the upper limit of power supply voltage Vcc, the change speed of signal decreases for the lower limit of power supply voltage Vcc, and therefore the delay time becomes too long, thus delaying an activation timing for the sense amplifier accordingly, and prolonging accessing time.

For example, consider that 2 ns are secured as delay time for the upper limit of Vcc=3.6V. In this case, for the lower limit of Vcc=3.0V, the current driving capability of the MOS transistor forming the inverter decreases by about 55%. If therefore an increase of charge/discharge amount by 25% for the capacitor at the upper limit of power supply voltage is taken into account, the delay time increases by about 25% (1.56/1.25=1.25) to be about 2.5 ns. Therefore, the extra delay time of 0.5 ns result in increase in accessing time through the delay of the sense amplifier activation timing, and the performance of the semiconductor memory device is degraded as a result.

In order to reduce the dependence of the delay time on power supply voltage as described above, a delay circuit as shown in FIG. 17A has been used. In FIG. 17A, the delay circuit includes a first inverter formed of MOS transistors PT1 and NT1, and a second inverter formed of MOS transistors PT2 and NT2. A resistor element R is connected between the source of p channel MOS transistor PT1 of the first inverter and power supply node Vcc. A capacitor C is connected between an intermediate node MN between the output node of the first inverter and the input node of the second inverter and the ground node. FIG. 17B is a waveform chart representing the operation of the delay circuit shown in FIG. 17A.

As shown in FIG. 17B, when input IN falls from an H level to an L level, p channel MOS transistor PT1 conducts, and current flows to intermediate node MN through resistor element R and MOS transistor PT1. Capacitor C is provided between intermediate node MN and the ground node. Therefore, the potential of intermediate node MN gradually rises in the speed determined by the time constant R·C of resistor element R and capacitor C. If the potential of intermediate node MN exceeds the input logical threshold value of the second inverter (MOS transistors PT2 and NT2), output signal OUT falls from an H level to an L level.

Since the potential rising speed of intermediate node MN is determined by time constant R·C and does not depend on power supply voltage Vcc, delay time for input signal IN corresponding to output signal OUT does not differ between the upper limit and the lower limit of Vcc. Therefore, even if the power supply voltage fluctuates, a necessary internal control signal (such as sense amplifier activation signal) can be activated with a prescribed delay time period.

In the delay circuit shown in FIG. 17A, if input signal IN rises from an L level to an H level, MOS transistor NT1 conducts, thereby discharging stored charges in capacitor C at a high speed.

As a configuration similar to that shown in FIG. 17A, resistor element R may be connected between the drain of p channel MOS transistor PT1 and the output node, or resistor element R may be connected to the source or drain of n channel MOS transistor NT1. However, the position to connect resistor element R may appropriately be determined depending on which one of the rising and falling of the input signal is delayed.

The input logical threshold value of the CMOS inverter may be given as follows:

$$Vith = {}^{Vthn}\!/\!{Vcc} + \sqrt{\beta p / \beta N}(1 - {}^{|Vthp|}\!/\!{Vcc})/1 + \sqrt{\beta p / \beta N} \cdot Vcc \qquad (1)$$

wherein Vthn and Vthp are threshold voltages of n channel MOS transistor and p channel MOS transistor, respectively, and βN and βp are transfer factors of n channel MOS transistor and p channel MOS transistor, respectively. The input logical threshold value Vith is usually fixed at the voltage level of Vcc/2. The input logical threshold value Vith therefore changes in response to change in power supply voltage Vcc, the threshold voltage of the MOS transistor, and change in the transfer factor β due to variations in the manufacturing parameters. If input logical threshold value Vith slightly changes, the delay time changes greatly for the configuration of the delay circuit shown in FIG. 17A. The change in the delay time will be described in conjunction with FIG. 18.

As illustrated in FIG. 18, if the logical threshold value of the second inverter (MOS transistors PT2 and NT2) is (A), output signal OUT changes at time tA. Meanwhile, if the logical threshold value of the second inverter (MOS transistors PT2 and NT2) is (B), in other words lowered, the output signal OUT changes at time tB earlier than time tA. The potential change of intermediate node MN is gradual. Therefore, a slight change in the logical threshold value increases time difference between tA and tB, thus greatly changing the delay time. If the delay time changes, the timing for activating the internal control signal (such as sense amplifier activation signal) of the semiconductor memory device greatly changes, the internal operation timing shift largely, and it would be difficult to secure stable operations. Particularly in the case of the sense amplifier activation signal, an access time for accessing the semiconductor memory device greatly changes.

In a DRAM, many internal control signals are generated by delaying row address strobe signal RAS, in other words a memory cell selection operation initiation instruction signal, besides the sense amplifier activation signal, and the timing for internal operations (operations associated with row selection operation) is greatly shifted. As a result, and therefore it would be difficult to secure stable operation.

Along with the semiconductor memory device, generally in semiconductor integrated circuit devices, various signals are generated by delaying a certain signal. For example, such various signals are produced by generating a one shot pulse when a signal changes, by processing a certain signal and further processing the result of processing with the original signal, and by delaying the original signal until the processing result signal is ascertained. In any of the cases, the delay circuit preferably provides fixed delay time irrespectively of fluctuation in power supply voltage Vcc and input logical threshold value in succeeding stages.

SUMMARY OF THE INVENTION

It is an object of the invention to provide a delay circuit which provides fixed delay time irrespectively of fluctuations in the input logical threshold value of a logic circuit in a succeeding stage and the power supply voltage Vcc.

Another object of the invention is to provide a delay circuit capable of generating a stable internal control signal with fixed delay time, particularly in a semiconductor memory device.

A delay circuit according to the present invention includes an integral portion for integrating an input signal, reference voltage generation portion for changing the output voltage level to a prescribed voltage level in response to the change of the input signal and outputting the changed voltage, and comparison circuit for comparing the output signal of the integral portion and voltage output from the reference voltage generation portion and outputting a signal indicating the result of comparison.

A signal resulting from integration of an input signal changes more gradually than the change of the input signal. The output signal of the integral portion is compared with fixed reference voltage, in order to determine the voltage level of the output signal of the comparison portion based on whether the output signal of the integral portion is higher or lower than the reference voltage. If the reference voltage is a multiple of the power supply voltage, the output signal of the comparison circuit may be changed free from the influence of fluctuations in the power supply voltage and therefore delay time free from the influence of the fluctuations in the power supply voltage may be provided.

The reference voltage generation portion has an output reference voltage set at a prescribed reference voltage level when a comparison operation is executed in the comparison circuit, the reference voltage level is free from the influence of other circuit operations, therefore the comparison circuit may surely compare the prescribed reference voltage and the output signal of the integral portion, and accurate delay time may be provided. Since the output signal of the comparison circuit is applied to a logical circuit in a succeeding stage, the output signal of the comparison circuit greatly changes in response to the voltage level of the output signal of the integral portion with reference to the reference voltage level. If therefore the input logical threshold value of the succeeding stage logical circuit changes, the output signal of the succeeding stage logical circuit may reliably be changed, and the output signal of the succeeding stage may stably be changed with fixed delay time without the influence of the input logical threshold value of the succeeding stage logical circuit.

Use of the delay circuit as a sense amplifier activation signal generation circuit in a semiconductor memory device permits stable activation of a sense amplifier with fixed delay time, thereby reducing an access time.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIG. 1 is a diagram schematically showing the entire configuration of a delay circuit according to a first embodiment of the invention;

FIG. 2 is a signal waveform chart representing the operation of the delay circuit shown in FIG. 1.

FIG. 12 is a graph showing the current-voltage characteristic of a subthreshold region in an MOS transistor;

FIG. 13 is a diagram schematically showing the configuration of an array portion in a conventional semiconductor memory device;

FIG. 14 is a signal waveform chart for use in illustration of the operation of the semiconductor device shown in FIG. 13;

FIG. 15A shows an example of a conventional delay circuit;

FIG. 15B is a signal waveform chart for use in illustration of the operation of the delay circuit shown in FIG. 15A;

DESCRIPTION OF THE PREFERRED EMBODIMENTS

First Embodiment

Figure 3:
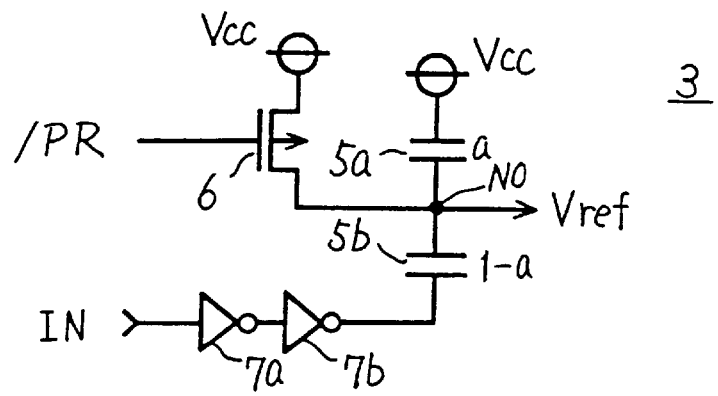
FIG. 3 is a diagram showing the configuration of a reference voltage generation circuit shown in FIG. 1.

FIG. 1 is a diagram showing the configuration of a delay circuit according to a first embodiment of the invention. In FIG. 1, the delay circuit includes an inverter 1a inverting an input signal IN, an RC delay stage 2 formed of a resistor element R and a capacitor C functioning as integral means for gradually changing the output signal of inverter 1a, a reference voltage generation circuit 3 for outputting a fixed reference voltage Vref, comparison circuit 4 for comparing the output signal of RC delay stage 2 and reference voltage Vref, and two stages of cascaded inverters 1b and 1c for buffering the output signal of comparison circuit 4 for output.

Comparison circuit 4 receives reference voltage Vref at its positive input and the output signal of RC delay stage 2 at its negative input. Comparison circuit 4 therefore outputs an L level signal if the output signal of RC delay stage 2 is higher than reference voltage Vref, while outputs an H level signal if the output signal of RC delay stage 2 is lower than reference voltage Vref. Now, the operation of the delay circuit shown in FIG. 1 will be detailed in conjunction with FIG. 2, a waveform chart representing the operation.

Before time t0, input signal IN is at an H level, the potential level of an intermediate node MN is at an L level and the output signal COUT of comparison circuit 4 is at an H level. An output signal OUT from inverter 1c is also at an H level.

If, at time t0, input signal IN falls from the H level to an L level, the output signal of inverter 1a rises. In this case, the potential of the output node of RC delay stage 2, in other words the potential of intermediate node MN gradually rises according to an RC time constant determined by resistor R and capacitor C. If the potential level of intermediate node MN attains a level higher than the voltage level of reference voltage Vref from reference voltage generation circuit 3, the output signal COUT of comparison circuit 4 falls to an L level at a high speed. Comparison circuit 4, the configuration of which will be described later, has the function of amplifying a comparison result. The output signal COUT of comparison circuit 4 is at an H level of a voltage level sufficiently higher than the input logical threshold value of inverter 1b if the potential of intermediate node MN is lower than potential Vref. If the potential level of intermediate node MN is higher than reference voltage Vref, the voltage level of the output signal COUT of comparison circuit 4 is at a voltage level sufficiently lower than the input logical threshold value of inverter 1b. Therefore even if the input logical threshold value of inverter 1b fluctuates due to variations in the manufacturing parameters for example, the output signal of inverter 1b changes at a high speed without the influence of the fluctuation in the input logical threshold value, and the output signal OUT from inverter 1c falls from the H level to an L level at time t1 accordingly. The delay time T between time t1 and time t0 may therefore be maintained as a fixed time period without the influence of fluctuations in the input logical threshold values of inverters 1b and 1c functioning as a logic circuit.

Reference voltage Vref should be provided as a constant multiple (multiplied by constant, a, equal to or small than 1) of power supply voltage Vcc.

The voltage level when intermediate node MN falls is given by the following expression:

$$Vcc \cdot exp(-t/RC)$$

Meanwhile, the voltage level of intermediate node MN when the potential of intermediate node MN rises from an L level to an H level is given by the following expression:

$$Vcc \cdot (1-exp(-t/RC))$$

Delay time periods at the rising and falling of the potential of intermediate node MN are given by the following expressions, respectively;

$$Vref = Vcc \cdot a = Vcc \cdot exp(-t/RC)$$

$a = exp(-t/RC)$ . . . at falling $$Vref = Vcc \cdot a = Vcc \cdot (1-exp(-t/RC))$$

$a = 1-exp(-t/RC)$ . . . at rising.

Therefore, delay time t=T does not depend on power supply voltage Vcc but is determined by the resistance value of resistor element R and the value of capacitance of capacitor C. The output signal of comparison circuit 4, and hence the output signals of inverters 1b and 1c may be changed with fixed delay time t=T irrespectively of the influence of fluctuations in power supply voltage Vcc.

In the configuration shown in FIG. 1, change amounts at the rising and falling in potential of intermediate node MN are the same. For input signal IN, the falling of output signal OUT has the same delay time.

As described above, according to the first embodiment of the invention, since the input signal is gradually changed using the integral means, and the output signal of the integral means and reference voltage Vref are compared by the comparison circuit, if the output signal of integral means changes across the reference voltage, the output signal of the comparison circuit may greatly be changed at a high speed and therefore time delay may be substantially fixed irrespectively of fluctuations in the input logical threshold value of a logic circuit in a succeeding stage. If the reference voltage is set to a constant multiple of power supply voltage Vcc, the delay time may be set independently of the power supply voltage, and the delay time may be set to a fixed time period free from fluctuations in the power supply voltage.

Second Embodiment

FIG. 3 is a diagram specifically showing the configuration of reference voltage generation circuit 3 shown in FIG. 1. In FIG. 3, reference voltage generation circuit 3 includes a capacitor 5a functioning as a first capacitance element and connected between a power supply node Vcc (voltage and node are denoted with the same reference characters) and an output node N0, a capacitor 5b functioning as a second capacitance element and coupled between output node N0 and an input node receiving an input signal IN, a p channel MOS transistor 6 for precharging output node N0 to power supply voltage Vcc level in response to a precharge instruction signal /PR, and two stages of cascaded inverters 7a and 7b functioning as a buffer for transferring input signal IN to an electrode of capacitor 5b.

Figure 4:
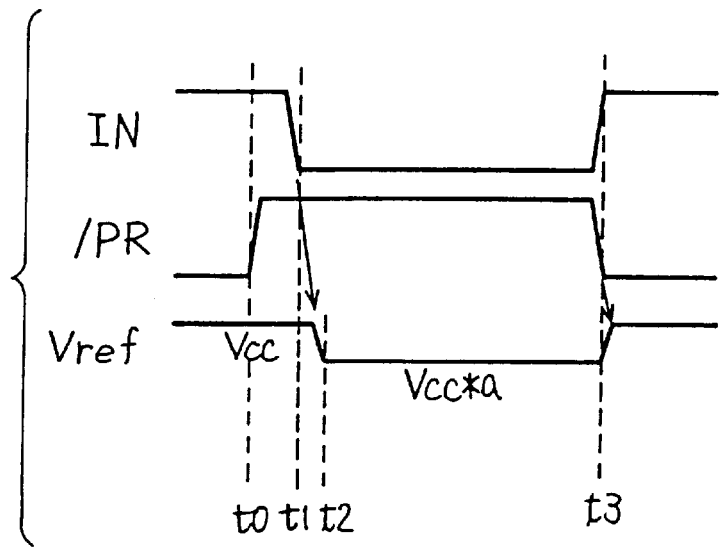
FIG. 4 is a signal waveform chart for use in illustration of the operation of the reference voltage generation circuit shown in FIG. 3.

The ratio of the capacitance values of capacitors 5a and 5b is set at a:(1−a), where a is a real number between 0 and 1. Reference voltage Vref is output from output node N0. Precharge instruction signal /PR attains an H level in an inactive state in a timing earlier than the change of input signal IN. More specifically, precharge instruction signal /PR attains an inactive state only when the comparison operation of comparison circuit 4 is necessary. In other periods, during the period in which the comparison operation of the comparison circuit is not necessary, precharge instruction signal /PR is at an active L level. In the active state of precharge instruction signal /PR, p channel MOS transistor 6 conducts, and output node N0 is precharged to the power supply voltage Vcc level. The operation of reference voltage generation circuit 3 shown in FIG. 3 will be detailed in conjunction with FIG. 4, a waveform chart representing the operation.

Before time t0, input signal IN is at an H level, and precharge instruction signal /PR is in an L level active state. In this state, output node N0 is precharged to the power supply voltage Vcc level. The potentials at both electrodes of each of capacitors 5a and 5b are at the power supply voltage Vcc level, with no potential difference being present between them.

At time t0, precharge instruction signal /PR rises to an H level, MOS transistor 6 attains a non-conduction state, and output node N0 stops being precharged. In this state, although output node N0 attains an electrically floating state, input signal IN is at an H level, and reference voltage Vref from output node N0 maintains power supply voltage Vcc level in the precharge state.

At time t1, when input signal IN falls from the H level to an L level, the electrode potential of capacitor b falls to the L level of the ground potential level through inverters 7a and 7b. Thus, due to the capacitive coupling by capacitor 5b, the potential of output node N0 falls. The voltage level of output node N0 is derived by the following equation based on the principle of conservation of charge.

$$(C(5a)+C(5b))\cdot Vcc - C(5b)\cdot Vcc = Vref \cdot (C(5a)+C(5b)) \therefore Vref = C(5a)\cdot Vcc/(C(5a)+C(5b))$$

wherein C(5a) and C(5b) are the capacitance values of capacitors 5a and 5b, respectively. The ratio of capacitances of capacitors 5a and 5b is a:1−a. Therefore the following equation holds.

$$Vref = a\cdot Vcc$$

At time t2 at which reference voltage Vref changes to the voltage level of Vcc·a, the comparison circuit compares input signal IN and reference voltage Vref, and amplifies the result of comparison for output.

If the comparison operation completes, at time t3, precharge instruction signal /PR once again attains an active L level, MOS transistor 6 conducts, and reference voltage Vref from node N0 once again rises to the level of power supply voltage Vcc.

In reference voltage generation circuit 3 shown in FIG. 3, output node N0 is precharged to the level of power supply voltage Vcc, and the voltage level of reference voltage Vref from output node N0 is lowered by capacitive coupling. There is no path for DC current to flow between power supply node Vcc and ground node (the ground node of inverter 7b). Therefore, no through current for generating reference voltage is caused, and current consumption may be reduced. Reference voltage Vref as will be described later is supplied to the gate of an MOS transistor in an input stage constituting the comparison circuit. Output node N0 should simply raises the gate voltage of the MOS transistor, a large charge supply capability is not necessary, and therefore reference voltage Vref needed to be supplied stably may be generated in a small occupied area.

Reference voltage generation circuit 3 shown in FIG. 3 further provides the following advantage. If reference voltage Vref is generated by a usual voltage dividing circuit with a resistor element, through current should flow through the resistor element. If the resistance value of the resistor element is set large enough in order to reduce such through current, the output impedance of the reference voltage generation circuit is increased, and the influence of noises upon the reference voltage increases. Use of capacitors 5a and 5b for generating reference voltage Vref may reduce current consumption without such through current. Since any output noise is absorbed by capacitors 5a and 5b, reference voltage Vref may stably be generated free from the influence of noises.

In addition, since precharge instruction signal /PR is used only when desired to change the voltage level of the reference voltage, if the operation of another circuit is effected before the operation of comparison circuit, output node N0 is in a precharge state at the time, and therefore, reference voltage at a necessary voltage level may accurately be generated free from the influence of the operation of that another circuit.

Reference voltage generation circuit 3 provided only for the delay circuit needs only to drive the delay circuit and does not require a large charge driving capability, and therefore the reference voltage generation circuit with a small occupied area may be implemented.

Figure 5:
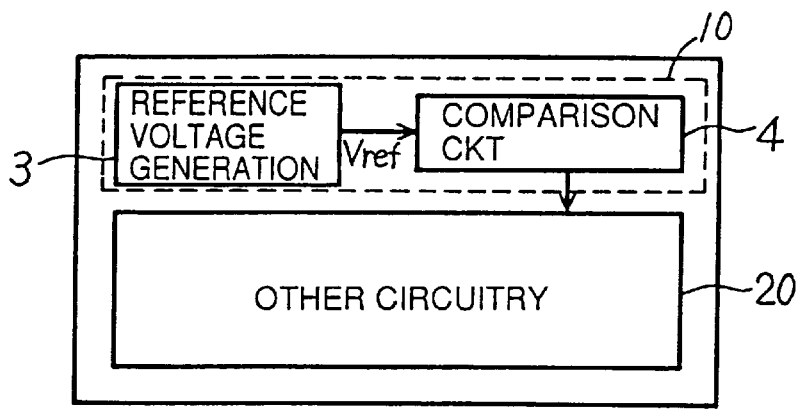
FIG. 5 is a diagram for use in illustration of the effect of the reference voltage generation circuit shown in FIG. 3.

More specifically, as shown in FIG. 5, reference generation circuit 3 is formed to supply reference voltage Vref only to comparison circuit 4 included in delay circuit 10 and is therefore free from the influence of the operation of another circuitry 20 included in the semiconductor integrated circuit device. Reference voltage Vref may therefore be generated stably and with reduced current consumption and in a small occupied area.

Figure 6:
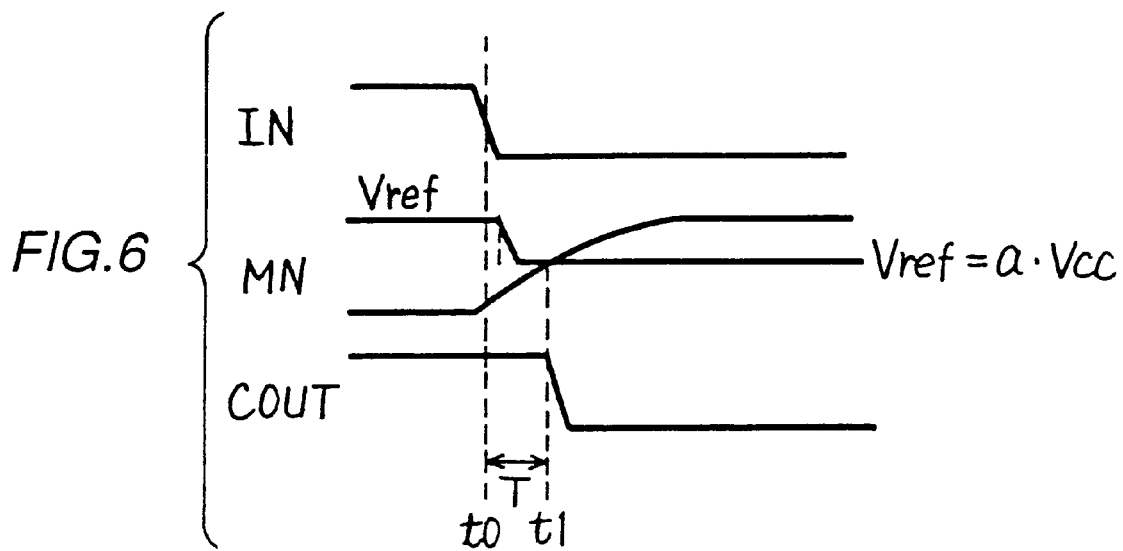
FIG. 6 is a signal waveform chart showing the relation between the reference voltage of the reference voltage generation circuit and the output signal of a comparison circuit shown in FIG. 3.

FIG. 6 is a chart showing the relation between reference voltage Vref and the output COUT of the comparison circuit. At time t0, input signal IN is pulled from an H level to an L level, and the voltage level of intermediate node MN gradually rises based on time constant RC in the RC delay stage. In response to the falling of input signal IN in the voltage level, reference voltage Vref output from reference voltage generation circuit 3 falls from the level power of supply voltage Vcc to a prescribed voltage level a·Vcc.

At time t1, the potential on intermediate node MN crosses the voltage level of reference voltage Vref, the output signal COUT of the comparison circuit falls from an H level to an L level. Now, delay time T will be specifically obtained.

The potential of intermediate node MN rises based on Vcc·(1−exp(−t/RC)). Delay time T may therefore be obtained from the following expressions:

$$1-\exp(-t/RC)=a$$

$$T=R\cdot C\cdot \log(1-a)$$

As can be seen from the above expressions, delay time T is determined based on the resistance value and capacitance value of resistor element R and capacitor C included in the RC delay stage and the ratio of capacitances of capacitors 5a and 5b. The delay time does not depend on power supply voltage Vcc and the threshold voltage of the MOS transistor. Therefore as compared to the configuration of a reference voltage generation circuit using the threshold voltage of an MOS transistor, a delay circuit providing a stable fixed delay time free from the influences of power supply voltage Vcc and the threshold voltage Vth of the MOS transistor may be implemented. In the reference voltage generation circuit using the threshold voltage of the MOS transistor, as the case with a voltage dividing circuit using a resistance element, through current flows from the power supply node to the ground node, and consumption current may not be reduced.

If reference voltage is generated by capacitive coupling, the reference voltage level is determined based on the capacitance ratio of the capacitors. The capacitance ratio of the capacitors may readily be implemented by adjusting the ratio of electrode areas of the capacitors. Therefore, capacitors having an accurate capacitance ratio may be implemented without complicated manufacturing processes, and a necessary reference voltage level may readily and accurately be generated.

Note that in the reference voltage generation circuit shown in FIG. 3, the output node is precharged to the power supply voltage Vcc level, and the electrode of capacitors 5b is discharged to the ground potential level in response to input signal IN, in order to extract charges from output node N0. Alternatively, capacitor 5a may be connected between the ground node and output node N0 which is precharged to the ground potential level, and charges may be supplied to output node N0 through capacitor 5b in response to input signal IN. In the case, reference voltage Va becomes (1−a)·Vcc, i.e., a constant multiple of power supply voltage Vcc, and a necessary reference voltage level may be obtained, while delay time independent of power supply voltage Vcc may be implemented as well.

As described above, according to the second embodiment of the invention, since reference voltage at a desired voltage level is generated only when necessary, taking advantage of the charge pumping operation of the capacitor in the reference voltage permitting delay time independent of the power supply voltage and the threshold voltage of the MOS transistor may stably be generated with reduced power consumption and in a reduced occupied area without the influence of noises.

Third Embodiment

Figure 7:
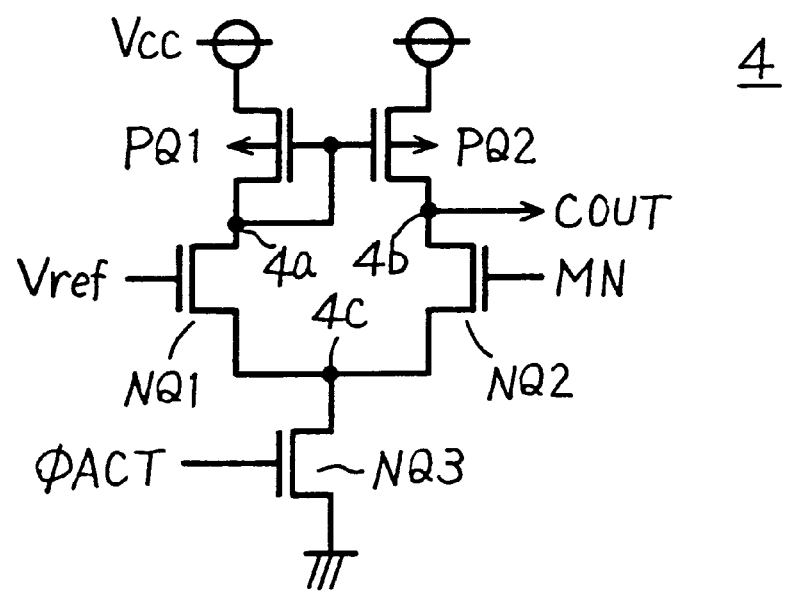
FIG. 7 is a diagram showing the configuration of the comparison circuit shown in FIG. 1.

FIG. 7 is a diagram specifically showing the configuration of a comparison circuit 4 shown in FIG. 1. In FIG. 7, comparison circuit 4 includes a p channel MOS transistor PQ1 connected between a power supply node Vcc and an internal node 4a and having its gate connected to internal node 4a, a p channel MOS transistor PQ2 connected between power supply node Vcc and an output node 4b and having its gate connected to internal gate 4a, an n channel MOS transistor NQ1 connected between internal nodes 4a and 4c and receiving reference voltage Vref at its gate, an n channel MOS transistor NQ2 connected between output node 4b and internal node 4c and having its gate connected to the intermediate node MN, and an n channel MOS transistor NQ3 connected between internal node 4c and a ground node and receiving a comparison circuit activation signal φACT at its gate. MOS transistors PQ1 and PQ2 constitute a current mirror circuit. Now operation will be briefly described.

With comparison circuit activation signal φACT in an L level inactive state, MOS transistor NQ3 is in a non-conduction state. In the state, the path of current from power supply node Vcc to the ground node is cut off and output node 4b is charged to the power supply voltage Vcc level.

If comparison circuit activation signal φACT attains an H level active state, MOS transistor NQ3 is turned on, and the path of current from power supply node Vcc to the ground node is formed. If reference voltage Vref is higher than the potential of intermediate node MN, the conductance of MOS transistor NQ1 becomes larger than the conductance of MOS transistor NQ2, and current flowing through NOS transistor NQ1 becomes larger than current flowing through MOS transistor NQ2. Since MOS transistors PQ1 and PQ2 constitute a current mirror circuit, the mirror current of the current flowing through MOS transistor NQ1 is applied to MOS transistor NQ2. MOS transistor NQ2 therefore cannot discharge all the current supplied from MOS transistor PQ2, and the potential level of an output signal COUT from node 4b rises to an H level.

Meanwhile, if reference voltage Vref is lower than the potential on intermediate node MN, the conductance of MOS transistor NQ2 becomes larger than the conductance of MOS transistor NQ1, and MOS transistor NQ2 may supply current larger than the current flowing through MOS transistor NQ1. The mirror current of MOS transistor NQ1 is supplied to MOS transistor NQ2 through MOS transistor PQ2, and therefore MOS transistor NQ2 discharges all the current supplied, pulling output signal COUT from output node 4b to an L level. Since MOS transistor NQ3 functions as a current source, increase in the discharge current of MOS transistor NQ2 reduces current flowing through MOS transistor NQ1, and the mirror current from MOS transistor PQ2 is reduced accordingly, pulling output signal COUT to an L level at a high speed.

A signal of a small amplitude may be amplified at a high speed, using the current mirror type differential amplifier circuit shown in FIG. 7, and if the voltage on intermediate node MN becomes even slightly larger than reference voltage Vref, output signal COUT may be pulled from an H level to an L level at a high speed. If comparison circuit 4 is entered into an operable state only when a comparison operation is conducted with the activation signal φACT, the through current of comparison circuit 4 in a standby-state may be restrained, and current consumption may be reduced accordingly.

As described above, if the current mirror type differential amplifier circuit is used as a comparison circuit which is rendered operable only when a comparison operation is necessary, the potential on the intermediate node and the reference voltage may be compared with reduced current consumption and the result of comparison may be amplified for output. The logic level of the output signal of a next stage logic circuit may surely be changed irrespectively of fluctuations of the input threshold voltage of the next stage logic circuit, and fixed delay time may be provided free from the influence of fluctuations of the input logical threshold value of the next stage logic circuit.

Fourth Embodiment

Figure 8:
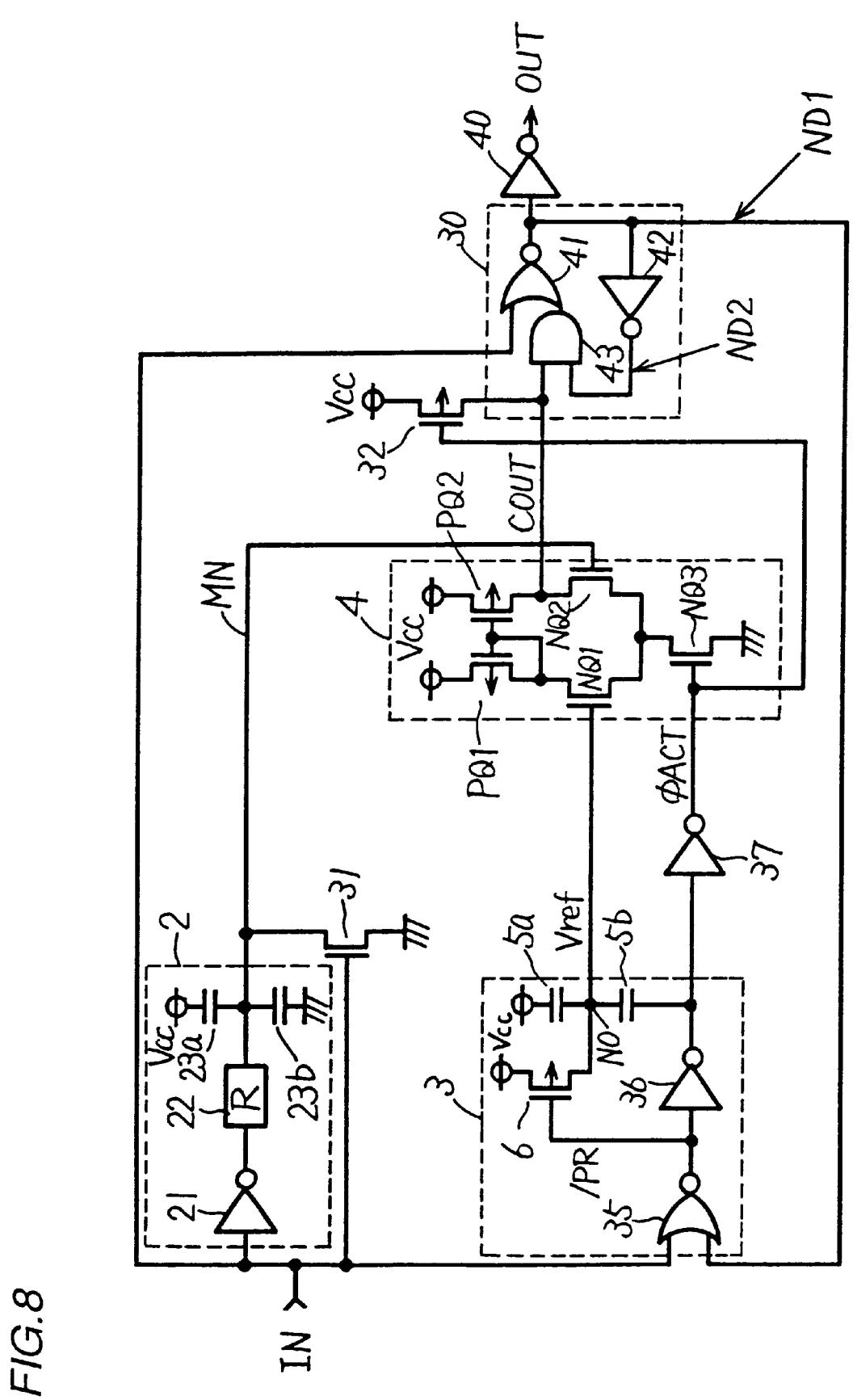
FIG. 8 is a diagram showing in detail a specific configuration of a delay circuit according to the present invention.

FIG. 8 is diagram specifically showing the configuration of a delay circuit according to the present invention. As shown in FIG. 8, the delay circuit includes a delay stage 2 functioning as an integral means for slowing the change of input signal IN, a reference voltage generation circuit 3 having a changeable output voltage level, a comparison circuit 4 for comparing voltage supplied on intermediate node MN from delay stage 2 and reference voltage Vref, a latch circuit 30 for latching the output signal COUT of comparison circuit 4, an inverter 40 for inverting the output signal of latch circuit 30 to generate an output signal OUT, an n channel MOS transistor 31 for resetting intermediate node MN to the ground potential level in response to input signal IN, an inverter 37 for generating comparison circuit activation signal φACT, and a p channel MOS transistor 32 which conducts when comparison circuit activation signal φACT is inactive, and charges the output signal COUT of the comparison circuit to the power supply voltage level.

Delay stage 2 includes an inverter 21 receiving input signal IN, a resistor element 22 receiving the output signal of inverter 21, a capacitor 23a connected between the output node of the resistance element and power supply node Vcc, and a capacitor 23b connected between the output node of resistor element 22 and the ground node. The configuration of delay stage 2 is substantially the same as the configuration of inverter 1a and RC delay stage 2 shown in FIG. 1. Resistor element 22 and capacitors 23a and 23b constitute an RC delay circuit, and the output signal of inverter 21 changes gradually.

Reference voltage generation circuit 3 includes a 2-input NOR circuit 35 receiving input signal IN and the output signal of latch circuit 30, a p channel MOS transistor 6 turned on when the output signal of NOR circuit 35 attains an L level to precharge output node N0 to the power supply voltage Vcc level, a capacitor 5a connected between power supply node Vcc and output node N0, an inverter 36 receiving the output signal of NOR circuit 35, and a capacitor 5b connected between output node N0 and the output portion of inverter 36. A precharge instruction signal /PR is output from NOR circuit 35.

Comparison circuit 4 has the same configuration as the comparison circuit shown in FIG. 7, and therefore corresponding portions are denoted with the same reference numerals and characters, with description thereof being omitted. More specifically, comparison circuit 4 is a current mirror type differential amplifier circuit. An inverter 37 which generates comparison circuit activation signal φACT receives the output signal of inverter 36. Precharge instruction signal /PR and comparison circuit activation signal φACT are therefore signals in phase, and after reference voltage Vref is pulled to a prescribed voltage (a·Vcc) level, comparison circuit activation signal φACT is pulled to an active H level (taking into consideration delay time by inverters 36 and 37).

Figure 9:
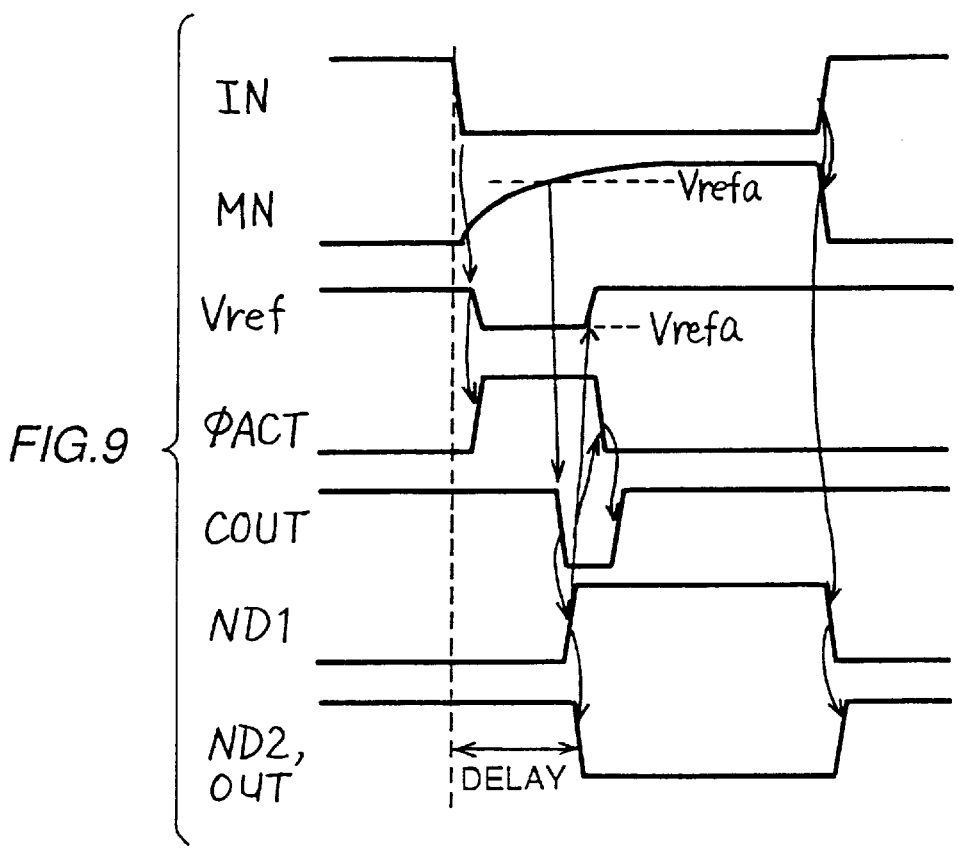
FIG. 9 is a signal waveform chart for use in illustration of the operation of the delay circuit shown in FIG. 8.

Latch circuit 30 includes an NOR gate 41 receiving input signal IN at its one input. An inverter 42 inverting the output signal of NOR gate 41, and an AND gate 43 receiving the output signal of inverter 42 and the output signal COUT of the comparison circuit. The output signal of AND gate 43 is applied to the other input of NOR gate 41. NOR gate 41 and AND gate 43 constitute a AND-OR composite gate. The function and effects of the latch circuit will be described later. With reference to the operation waveform chart shown in FIG. 9, the operations of the delay circuit shown in FIG. 8 will be described.

With input signal IN at an H level, precharge instruction signal /PR from NOR circuit 35 in reference voltage generation circuit 3 is at an L level, and reference voltage Vref is precharged to the power supply voltage Vcc level through MOS transistor 6. Latch circuit 30 outputs a signal at an L level in response to the H level input signal IN, and therefore output signal OUT from inverter 40 attains an H level. Since comparison circuit activation signal φACT is in an inactive state, comparison circuit 4 is in a non-operation state, and output signal COUT therefrom is pulled up to the power supply voltage Vcc level by MOS transistor 32.

If input signal IN is pulled from the H level to an L level, the output signal of inverter 21 in delay stage 2 is transferred to intermediate node MN through resistor element 22 and capacitors 23a and 23b, and the potential level of intermediate node MN is gradually raised. Meanwhile, if input signal IN is pulled to an L level, the potential level of the output node of latch circuit 30, in other words the voltage level of node ND1 is at an L level, and the output signal of NOR circuit 35 of reference voltage generation circuit 3 attains an H level, precharge instruction signal /PR attains an H level, thus stopping precharging of reference voltage Vref. Then, the output signal of inverter 36 is pulled to an L level, and the voltage level of reference voltage Vref is lowered to prescribed potential Vrefa by capacitive coupling of capacitor 5b. Comparison circuit activation signal φACT from inverter 37 attains an H level, thus activating comparison circuit 4, and the potential levels of reference voltage Vref and intermediate node MN are compared. In response to an activation of comparison circuit activation signal φACT, MOS transistor 32 is turned off, and the operation of pulling up output signal COUT to the power supply voltage Vcc level is stopped.

If the voltage level on intermediate node MN becomes higher than the level of reference voltage Vref (Vrefa), output signal COUT from comparison circuit 4 is pulled to an L level. The output signal of AND gate 43 in latch circuit 30 attains an L level accordingly, and the output signal of NOR gate 41 attains an H level. The H level signal output onto node ND1 from NOR gate 41 is inverted by inverter 42 and applied to AND gate 43. AND gate 43 therefore outputs an H level signal based on the L level signal from inverter 42, and the H level signal on node ND 1 is latched by NOR gate 41, inverter 42, and AND gate 43.

If the voltage level of node ND1 is pulled to an H level, again in reference voltage generation circuit 3, precharge instruction signal /PR from NOR circuit 35 attains an L level, and MOS transistor 6 conducts, thus precharging the reference voltage Vref to the power supply voltage Vcc level. If the output signal of NOR circuit 35 attains an L level, comparison circuit activation signal φACT attains an L level, and comparison circuit 4 attains an inactive state, the comparison operation of which is stopped. Meanwhile MOS transistor 32 conducts, and charges the output signal COUT of comparison circuit 4 to the power supply voltage Vcc level. In the state, the output signal of inverter 42 is at an L level, the output signal of AND gate 43 is at an L level, and the voltage level output onto node ND1 from NOR gate 41 maintains an H level.

After the output signal COUT of comparison circuit 4 changes and is latched by latch circuit 30, reference voltage generation circuit 3 is precharged, and the comparison operation of comparison circuit 4 is stopped, in order to maintain reference voltage Vref at a prescribed voltage level only during a minimum necessary time period. Therefore, a desired voltage level may accurately be achieved, accurate comparison operation may be conducted, and current consumption by comparison circuit 4 may be reduced by limiting the time period in which the comparison circuit operates.

If input signal IN is pulled from an L level to an H level MOS transistor 31 conducts and discharges intermediate node MN to the ground potential level at a high speed. In response to the rising of input signal IN to the H level, the voltage level of a signal output to node ND1 from NOR gate 41 attains an L level, and the voltage levels of output signal OUT and node ND2 are pulled to an H level accordingly. The L level potential on node ND1 is latched by latch circuit 30 because AND gate 43 outputs an H level signal and the output signal of NOR gate 41 is fixed at an L level.

MOS transistors 31 and 32 for resetting are provided while input signal IN is applied to the NOR gate 41 of latch circuit 30 and therefore only when input signal IN is pulled from an H level to an L level, the transition is delayed for a prescribed time period to pull output signal OUT from an H level to an L level. Output signal OUT may be pulled to an H level at a high speed when input signal IN is pulled from an L level to an H level. Therefore a delay circuit capable of providing a delay only to a desired level change in the input signal may be implemented.

It is noted that in the configuration shown in FIG. 8, if input signal IN rises, output signal OUT falls after passage of the prescribed delay time period. The transitions of input signal IN and output signal OUT may be reversed in phase.

As described above, in the delay circuit according to the fourth embodiment of the invention, since a precharges instruction signal for precharging reference voltage is generated based on an input signal and a latch signal of an output signal from a comparison circuit and a comparison circuit activation signal is generated based on the precharge instruction signal, a comparison operation may be conducted only during a minimum necessary time period with the reference voltage being set at a prescribed voltage level. Once the output signal is ascertained in response to a completion of a comparison operation, the reference voltage is precharged to the original power supply voltage level while stopping the comparison operation. Therefore, the reference voltage level during the comparison operation may accurately be set at a prescribed voltage level (without the influence of the operation of other circuits and the influence of noises), and the operation time period of the comparison circuit may be minimum necessary to reduce through current, thus reducing current consumption.

Further, as the case with the first to third embodiments, in the comparison operation the reference voltage level which is a constant multiple of power supply voltage is compared with the voltage level of an RC delayed input signal, the output signal of the comparison circuit may be changed accurately with a fixed delay time period irrespectively of the influence of changes of the power supply voltage and the threshold voltage of the MOS transistor, the output signal of latch circuit 30 and therefore the output signal from the inverter may be changed to a prescribed voltage level accurately without the influence of change of the input logical threshold value of the AND gate of the latch circuit, and the output signal may stably and accurately be changed with a prescribed delay time period relative to the input signal as a result.

Fifth Embodiment

Figure 10:
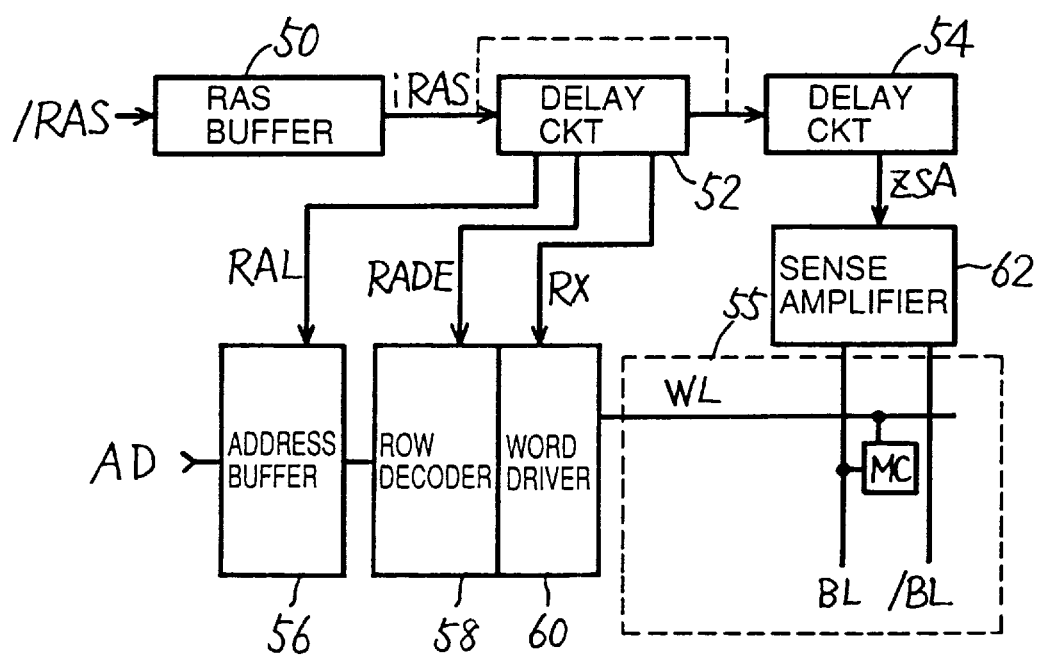
FIG. 10 is a diagram schematically showing the entire configuration of a semiconductor integrated circuit device to which the delay circuit according to the present invention is applied.

FIG. 10 is a diagram schematically showing the overall configuration of a semiconductor integrated circuit device according to a fifth embodiment of the invention. In FIG. 10, the semiconductor integrated circuit device includes an RAS buffer 50 receiving a row address strobe signal /RAS as a memory cell selection operation start instruction signal for generating an internal row address strobe signal iRAS; a delay circuit 52 for delaying internal row address strobe signal iRAS from RAS buffer 50, thereby generating a row address latch instruction signal RAL, a row address decode enable signal RADE and a word line drive signal RX; and a delay circuit 54 for generating a sense amplifier activation signal ZSA in response to an output signal from delay circuit 52. Delay circuits 52 and 54 include the configuration of the delay circuit shown in conjunction with the first to fourth embodiments.

Delay circuit 52 delays internal row address strobe signal iRAS for respective prescribed time periods to generate row address latch instruction signal RAL, row address decode enable signal RADE, and word line drive signal RX. Delay circuit 54 delays the output signal of delay circuit 52 (such as word line drive signal RX) for a prescribed time period to generate sense amplifier activation signal ZSA. Delay circuit 54 may generate sense amplifier activation signal ZSA by delaying internal row address strobe signal iRAS from RAS buffer 50 as denoted in the dotted line in FIG. 10.

The semiconductor integrated circuit device further includes a memory cell array 55 having memory cells MC arranged in rows and columns. Memory cell array 55 includes word lines WL each connected with a row of memory cells, and bit line pairs BL, /BL each connected with a column of memory cells. In FIG. 10, a single word line WL and a single bit line pair B1, /BL are shown by way of illustration. Bit line pair BL, /BL is provided with a sense amplifier 62.

Figure 11:
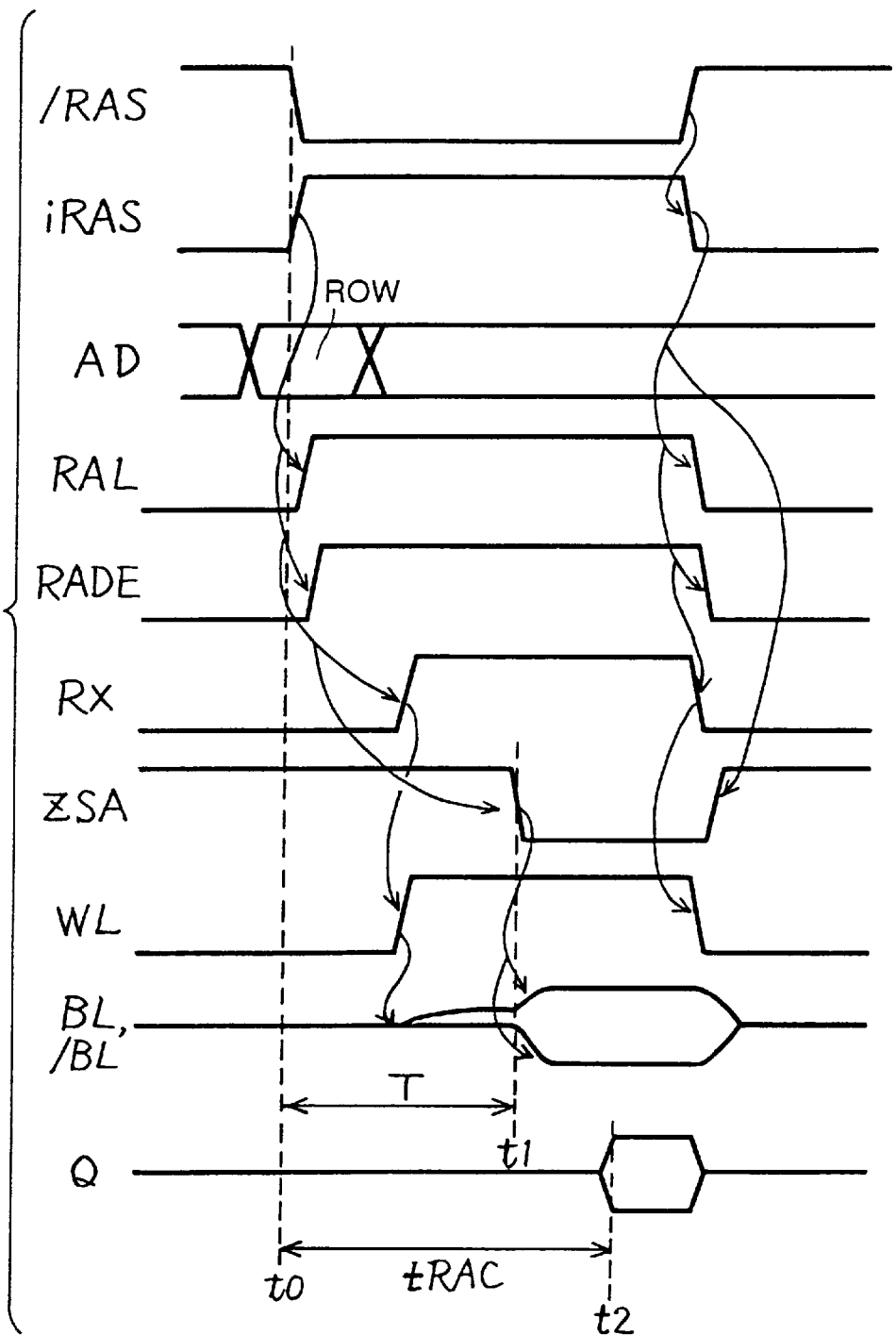
FIG. 11 is a signal waveform chart for use in illustration of the operation of the semiconductor integrated circuit device shown in FIG. 10.
Figure 16A:
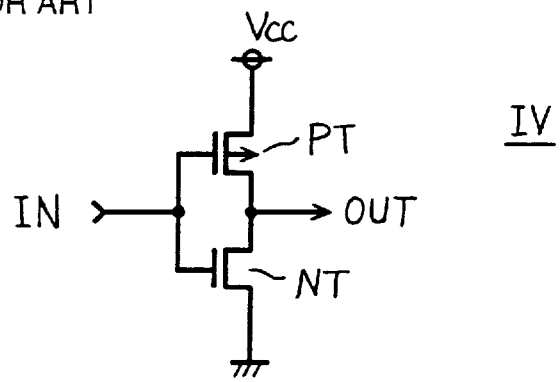
FIG. 16A is a diagram showing the configuration of a CMOS inverter.
Figure 16B:
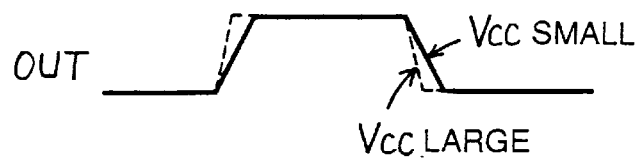
FIG. 16B is a waveform chart showing the output signal of the CMOS inverter shown in FIG. 16A.
Figure 17A:
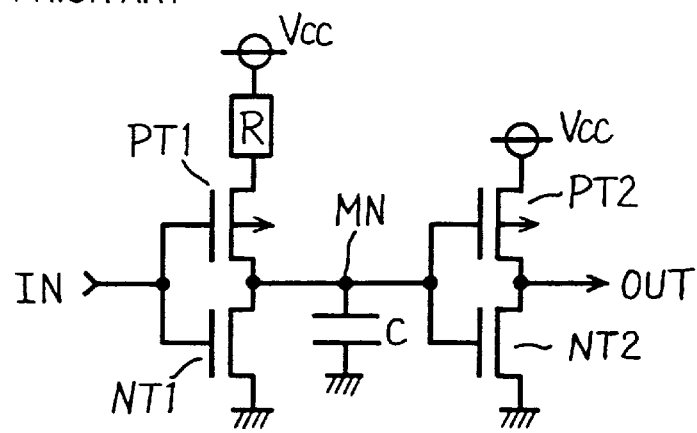
FIG. 17A is a diagram showing the configuration of another conventional delay circuit.
Figure 17B:
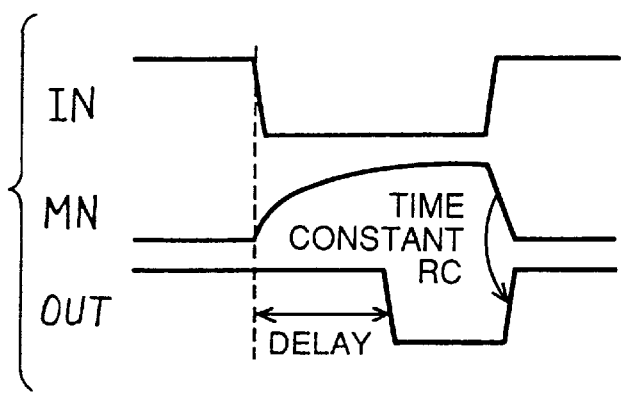
FIG. 17B is a waveform chart for use in illustration of the delay circuit shown in FIG. 17A.
Figure 18:
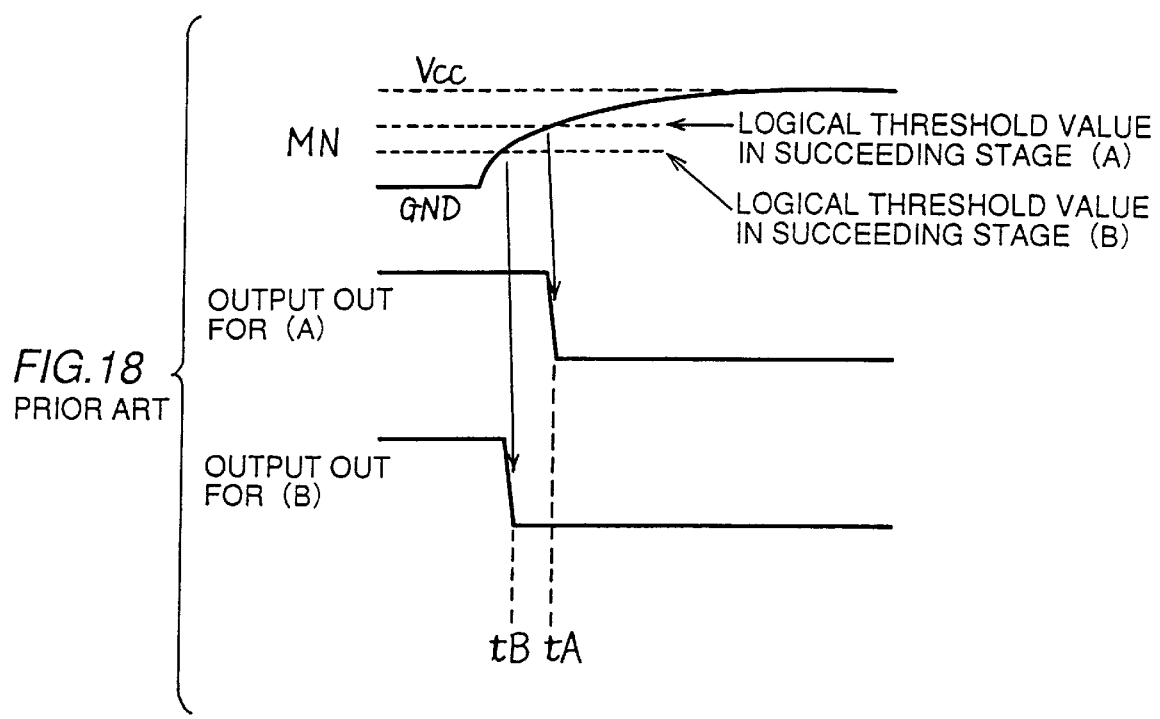
FIG. 18 is a waveform chart for use in illustration of problems associated with the delay circuit shown in FIG. 17.

The semiconductor integrated circuit device further includes an address buffer 56 for latching an address signal AD and generating an internal row address signal in response to row address latch instruction signal RAL, a row decoder 58 activated in response to row address decode enable signal RADE for generating and decoding complementary internal row address signals from the internal row address signals from address buffer 56 and generating a row selection signal to designate a row (word line) in memory cell array 55, and a word driver 60 for transferring word line drive signal RX onto the selected word line designated by row decoder 58. The operation of the semiconductor integrated circuit device shown in FIG. 10 will be described in conjunction with FIG. 11, an operation waveform chart thereof.

At time t0, row address strobe signal /RAS is pulled to an L level active state, thus starting a memory cycle. In response to the falling of row address strobe signal /RAS, internal row address strobe signal iRAS is pulled to an H level. In response to the rising of internal row address strobe signal iRAS, row address latch instruction signal RAL attains an "H" active state, address buffer 56 takes and latches an externally applied address signal AD and generates an internal row address signal. Row address decode enable signal RADE is set to an H level active state, thus activating row decoder 58. After the decoding operation of row decoder 58 completes, word line drive signal RX attains an "H" active state, word line drive signal RX in the active state is transferred onto a word line designated by row decoder 58, and the potential of word line WL rises. In response to the rising of the potential of word line WL, data in a memory cell MC connected to the selected word line WL is read out onto bit line BL (or /BL) and a potential difference results between bit lines BL and /BL.

Then after the potential of word line WL rises and the potential difference between bit line pair BL, /BL is developed enough (after passage of a prescribed delay time period), sense amplifier activation signal ZSA is pulled to an active state L level, and the potential difference between bit line pair BL, /BL is further expanded by sense amplifier 62. Thereafter, valid data is output at time t2 through a reading path which is not shown.

Use of the delay circuit shown in the first to fourth embodiment as delay circuits 52 and 54 as shown in FIG. 10 eliminates the influence of change of power supply voltage Vcc and the input logic threshold value, and each signal attains an active state with a fixed delay time period. Therefore time period T from time t0 at which row address strobe signal /RAS attains an active state until time t1 at which sense amplifier activation signal ZSA attains an active state may be a fixed time period even if the amplitude of each signal changes as the power supply voltage Vcc level changes. The data reading time does not have to be set by determining the timing for activating the sense amplifier by taking into account margin for changes of the power supply voltage Vcc and the input logical threshold value and the like, the delay time period T is always constant, and therefore time period tRAC (RAS access time) from time t0 at which row address strobe signal /RAS attains an active state till time t2 at which valid data is output may be minimized, thus permitting high speed accessing operation.

Herein the data reading circuitry is activated in response to a column address strobe signal /CAS. Column address strobe signal /CAS may usually be activated after passage of RAS-CAS delay time tRCD since the activation of row address strobe signal /RAS. Therefore, after the sense amplifier attains an active state, a column selection operation may be conducted in a relatively early timing by activating column address strobe signal /CAS, and data reading may quickly be made accordingly (the data reading timing is usually determined based on column address strobe signal /CAS).

As described above, according to the fifth embodiment of the invention when internal row address strobe signal /RAS is delayed to activate a sense amplifier activation signal, the reference voltage and the integrated internal row address strobe signal are compared to obtain delay time, it is not necessary to take into account margins for power supply voltage Vcc and input logical threshold value, and the threshold voltage of the MOS transistor for the time period until activation of the sense amplifier, and therefore the sense amplifier may be activated in a necessary minimum time period, thus permitting high speed accessing operation.

In particular, the timing for activating the sense amplifier is usually determined based on the ratio of the readout voltage ΔV on bit lines BL, /BL and the power supply voltage. Readout voltage ΔV is expressed as Cs·Vcc/2·Cb. Here, Cs represents the capacitance of a memory cell capacitor, and Cb represents a bit line capacitance. The speed of change of readout voltage ΔV reaching the sense amplifier (time constant) is determined based on the product Rb·Cb of the stray resistance Rb of the bit line and the capacitance Cb of the bit line and independently of the value of power supply voltage Vcc. Therefore use of a delay circuit having delay time independent of power supply voltage Vcc as a circuit for activating sense amplifier activation signal ZSA permits activation of the sense amplifier when readout voltage of a necessary level (changes based on time constant Rb·Cb) is developed onto the bit line (sense node) even if power supply voltage Vcc fluctuates, the sense amplifier may usually be activated in an optimum timing (in a fixed timing independently of power supply voltage Vcc), and stable sensing operation may be effected.

Other Applications

In the foregoing, the semiconductor integrated circuit device is described as a DRAM by way of illustration. The delay circuit according to the present invention, however, may be applied to any semiconductor integrated circuit device including a configuration in which a delay signal is generated from a certain signal for another usage.

Further, the present invention may be applied if the logic relation between input signal IN and delayed output signal OUT is either in phase or anti-phase. (An inverter may be provided at an input portion or an output portion).

As in the foregoing, according to the present invention, a delay circuit with stable fixed delay time and reduced current consumption may be implemented free from the influence of the threshold value of a logic circuit in a succeeding stage and independently of fluctuations of the power supply voltage.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A delay circuit comprising:
   integral means for integrating an input signal;
   reference voltage generation means responsive to a change in said input signal for generating an output voltage having a predetermined reference voltage level; and
   comparison means for comparing an output signal from said integral means and said output voltage from said reference voltage generation means and outputting a signal indicating a result of comparison, wherein
   said reference voltage generation means includes:
   a first capacitance element coupled between a first power supply node and an output node;
   a second capacitance element coupled between a node receiving said input signal and said output node; and
   precharge means responsive to a precharge instruction signal for precharging said output node to a first power supply voltage level on said first power supply node.

2. The delay circuit as recited in claim 1, wherein
   a ratio of the capacitances of said first capacitance element and said second capacitance element is a:(1−a), wherein said a is a real number between 0 and 1.

3. The delay circuit as recited in claim 1, further comprising:
  inversion means for inverting said input signal and transferring a resultant signal to said integral means;
  latch means for latching an output signal from said comparison means;
  precharge signal generation means responsive to the output signal from said latch means and said input signal for generating said precharge instruction signal;
  transfer means for inverting the precharge instruction signal from said precharge signal generation means and transferring the inverted precharge instruction signal to said second capacitance element; and
  comparison activation means responsive to inactivation of said precharge instruction signal for activating said comparison means.

4. The delay circuit as recited in claim 3, wherein
  said latch means includes a first logic gate receiving said input signal at a first input for outputting, when said input signal is at a second power supply voltage level, different from the first power supply voltage level, a signal at the first power supply voltage level as on said first power supply node, and functioning as an inverter when said input signal is at said first power supply voltage level;
  a first inverter for inverting an output signal from said first logic gate; and
  a second logic gate receiving an output signal from said first inverter and an output signal from said comparison means for buffering the output signal from said comparison means when the output signal from said inverter is at said second power supply voltage level, and for application to a second input of said first logic gate.

5. The delay circuit as recited in claim 1, further comprising:
  first reset means for resetting an output signal received from said integral means to a second power supply voltage level when said input signal is at said first power supply voltage level; and
  second reset means for resetting the output signal of said comparison means to said first power supply voltage level when said input signal is at said first power supply voltage level.

6. The delay circuit as recited in claim 1, wherein
  said delay circuit is used in a semiconductor memory device having a plurality of memory cells and a sense amplifier for detecting and amplifying storage data in a selected memory cell of said plurality of memory cells when said sense amplifier is activated,
  said input signal is a memory cell selection operation start instruction signal, and
  the output signal of said comparison means applies a timing for activating said sense amplifier.

7. The delay circuit as recited in claim 3, wherein
  said delay circuit is used in a semiconductor memory device having a plurality of memory cells and a sense amplifier for detecting and amplifying storage data in a selected memory cell of said plurality of memory cells when said sense amplifier is activated,
  said input signal is a memory cell selection operation start instruction signal, and
  the output signal of said latch means is used as a signal for activating said sense amplifier.

8. The delay circuit as recited in claim 1, wherein
  said integral means includes a resistor element and a capacitance element.

9. A delay circuit comprising:
  an integrator for integrating an input signal;
  a signal generator responsive to said input signal for generating a control signal corresponding to said input signal;
  a first capacitance element coupled between a power supply source supplying a power source voltage and an output node;
  a second capacitance element coupled between said output node and a node receiving said control signal;
  a precharge component responsive to activation of a precharge instruction signal for precharging said output node to a level of said power source voltage; and
  a comparator for comparing an output signal from said integrator and a voltage signal generated at said output node and outputting a signal indicating a result of the comparison.

10. The delay circuit according to claim 9, wherein said signal generator comprises a buffer for receiving and buffering said input signal to generate said control signal.

11. The delay circuit according to claim 9, wherein said signal generator comprises:
  a first logic rate circuit receiving said input signal and the signal from the comparator for generating a first signal corresponding to said input signal in response to transition of the signal from the comparator,
  a second logic rate receiving said input signal and said first signal for generating said precharge instruction signal through a negative logical sum operation of the input signal and the first signal, and
  an inverter for receiving and inverting in logic the precharge instruction signal to generate said control signal.

12. The delay circuit according to claim 11, wherein said first signal is different in logic level from said input signal.

13. The delay circuit according to claim 9, wherein said delay circuit is used in a semiconductor memory device including a plurality of memory cells arranged in rows and columns and a sense amplifier circuit for sensing and amplifying storage data in memory cells on a selected row among said rows when activated,
  said input signal is a signal instructing a start of operation for selecting a row of memory cells among the rows, and the output signal of said comparator applies a timing of activating said sense amplifier circuit.

14. A semiconductor circuit comprising:
  a first capacitance element coupled between a power supply node supplying a power source voltage and an output node;
  a second capacitance element coupled between said output node and a node receiving a signal dependent upon said input signal;
  a precharging component responsive to activation of a precharge instruction signal for precharging said output node to a level of said power source voltage; and
  comparison circuitry for comparing said input signal and a voltage signal at said output node to output a signal indicating a result of the comparison.

15. The semiconductor circuit according to claim 14, wherein said comparison circuitry comprises:
  an integrator for receiving and integrating the input signal, and
  a comparator for comparing an output signal of the integrator and the voltage signal at said output node.

* * * * *